US012805353B2

(12) United States Patent
Lee

(10) Patent No.: US 12,805,353 B2
(45) Date of Patent: Nov. 17, 2026

(54) CIRCUIT BOARD AND METHOD OF MANUFACTURING CIRCUIT BOARD

(71) Applicant: SAMSUNG ELECTRO-MECHANICS CO., LTD., Suwon-si (KR)

(72) Inventor: Kyehwan Lee, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 542 days.

(21) Appl. No.: 18/216,860

(22) Filed: Jun. 30, 2023

(65) Prior Publication Data

US 2024/0178121 A1 May 30, 2024

(30) Foreign Application Priority Data

Nov. 29, 2022 (KR) ........................ 10-2022-0163157

(51) Int. Cl.

| | |
|---|---|
| ***H10W 70/65*** | (2026.01) |
| ***H10W 70/05*** | (2026.01) |
| *H10P 72/70* | (2026.01) |
| *H10W 70/63* | (2026.01) |
| *H10W 72/00* | (2026.01) |
| *H10W 72/50* | (2026.01) |
| *H10W 90/00* | (2026.01) |

(52) U.S. Cl.

CPC ......... *H10W 70/65* (2026.01); *H10W 70/095* (2026.01); *H10P 72/74* (2026.01); *H10P 72/7424* (2026.01); *H10W 70/635* (2026.01); *H10W 72/07552* (2026.01); *H10W 72/527* (2026.01); *H10W 72/536* (2026.01); *H10W 90/754* (2026.01)

(58) Field of Classification Search

None

See application file for complete search history.

(56) References Cited

U.S. PATENT DOCUMENTS

| | | | | |
|---|---|---|---|---|
| 5,660,321 | A * | 8/1997 | Ishida .................. | H05K 3/3485 257/E21.511 |
| 2007/0205520 | A1* | 9/2007 | Chou .................. | H10W 72/019 257/E23.129 |
| 2018/0053715 | A1* | 2/2018 | Ishihara .................. | H10P 72/74 |
| 2019/0393143 | A1* | 12/2019 | Rosch .................... | H05K 1/111 |
| 2024/0172358 | A1* | 5/2024 | Ji ......................... | H05K 1/0298 |

FOREIGN PATENT DOCUMENTS

| | | | |
|---|---|---|---|
| JP | 2022-018196 | A | 1/2022 |
| KR | 10-1300413 | B1 | 8/2013 |

OTHER PUBLICATIONS

Office Action issued on Jan. 21, 2026 in Korean Patent Application No. 10-2022-0163157 with English translation.

* cited by examiner

*Primary Examiner* — Cory W Eskridge

(74) *Attorney, Agent, or Firm* — Morgan, Lewis & Bockius LLP

(57) ABSTRACT

A circuit board includes: a first insulating layer; a second insulating layer positioned on the first insulating layer; and a first pad portion and a second pad portion which are partially buried in the first insulating layer, protrude from the second insulating layer, and have different thicknesses. The first pad portion and the second pad portion each include a first layer and a second layer positioned on the first layer, and heights of the first layer of the first pad portion and the first layer of the second pad portion are lower than a height of the first insulating layer.

20 Claims, 22 Drawing Sheets

CIRCUIT BOARD AND METHOD OF MANUFACTURING CIRCUIT BOARD

CROSS-REFERENCE TO RELATED APPLICATION

This application claims priority to and the benefit of Korean Patent Application No. 10-2022-0163157 filed in the Korean Intellectual Property Office on Nov. 29, 2022, the entire contents of which are incorporated herein by reference.

TECHNICAL FIELD

The present disclosure relates to a circuit board and a method of manufacturing the circuit board.

BACKGROUND

As the electronic industry develops and electronic devices become increasingly high-performance, semiconductor packages are required to be miniaturized/thin and at the same time to have high-density. As the number of ICs mounted increases for the high-density of the package, the number of I/O connection terminals also increases, and as a result, it is necessary to secure process capability for realizing a microcircuit with a reduced bonding pad pitch.

The above information disclosed in this Background section is only for enhancement of understanding of the background of the described technology, and therefore it may contain information that does not form the prior art that is already known in this country to a person of ordinary skill in the art.

SUMMARY

The described technology has been made in an effort to provide a circuit board capable of preventing deterioration in connection characteristics of a microcircuit having a reduced bonding pad pitch, and a method of manufacturing the circuit board.

However, the object to be solved in the embodiments is not limited to the foregoing object, and may be variously extended in the scope of the technical spirit included in this disclosure.

An embodiment provides a circuit board, including: a first insulating layer; a second insulating layer positioned on the first insulating layer; and a first pad portion and a second pad portion which are partially buried in the first insulating layer, protrude from the second insulating layer, and have different thicknesses. The first pad portion and the second pad portion each include a first layer and a second layer positioned on the first layer, and heights of the first layer of the first pad portion and the first layer of the second pad portion are lower than a height of the first insulating layer.

A thickness of the first layer of the first pad portion may be substantially the same as a thickness of the first layer of the second pad portion.

A thickness of the second layer of the first pad portion and a thickness of the second layer of the second pad portion may be different from each other.

The circuit board may further include the first pad portion and the second pad portion each further include a third layer positioned on the second layer.

A thickness of the third layer of the first pad portion and a thickness of the third layer of the second pad portion may be substantially the same.

The first layer, the second layer, and the third layer may include different metals.

The first layer may include copper, the second layer may include nickel, and the third layer may include gold.

The second insulating layer may be located on a side surface of the second layer of the first pad portion and the second layer of the second pad portion, and a thickness of the second insulating layer positioned on the side surface of the second layer of the first pad portion and a thickness of the second insulating layer positioned on the side surface of the second layer of the second pad portion may be substantially the same.

The second insulating layer may include a solder resist layer.

The circuit board may further include a third insulating layer positioned under the first insulating layer; and a third pad portion buried in the third insulating layer.

The circuit board may further include a via layer located in the first insulating layer.

The first pad portion and the third pad portion may be connected to each other through the via layer.

Another embodiment provides a method of manufacturing a circuit board, the method including: forming, in a first insulating layer, a first layer of a first pad portion and a first layer of a second pad portion; forming, on the first insulating layer, a second insulating layer having a first opening overlapping the first layer of the first pad portion and a second opening overlapping the first layer of the second pad portion; forming a second layer of the first pad portion to be positioned on the first layer of the first pad portion within the first opening in a state where the second opening is covered with a first mask; and forming a second layer of the second pad portion to be positioned on the first layer of the second pad portion within the second opening in a state where the first opening is covered with a second mask. A thickness of the second layer of the first pad portion is different from a thickness of the second layer of the second pad portion.

The first layer of the first pad portion and the first layer of the second pad portion may be formed to have a height lower than a surface of the first insulating layer.

The forming of the first layer of the first pad portion and the first layer of the second pad portion buried in the first insulating layer may include: forming a first metal layer on a seed layer; stacking the first insulating layer on the first metal layer; removing the seed layer; and forming the first layer of the first pad portion and the first layer of the second pad portion by thinning the first metal layer.

Heights of the second layer of the first pad portion and the second layer of the second pad portion may be formed to be higher than a height of the second insulating layer by lowering the height of the second insulating layer.

A third layer of the first pad portion may be formed to be positioned on the second layer of the first pad portion within the first opening in the state where the second opening is covered with the first mask, a third layer of the second pad portion may be formed to be positioned on the second layer of the second pad portion within the second opening in the state where the first opening is covered with the second mask, and a thickness of the first layer of the first pad portion and a thickness of the first layer of the second pad portion may be formed to be substantially the same, and a thickness of the third layer of the first pad portion and a thickness of the third layer of the second pad portion may be formed to be substantially the same.

An embodiment provides a circuit board, including: a first insulating layer; a second insulating layer positioned on the first insulating layer; and a first pad portion and a second pad portion which are partially buried in the first insulating layer and protrude from an upper surface of the second insulating layer to have different heights with respect to the upper surface of the second insulating layer. The first pad portion and the second pad portion each include a first layer and a second layer disposed on the first layer. The first layer of the first pad portion and the first layer of the second pad portion include a first metal, and the second layer of the first pad portion and the second layer of the second pad portion have different thicknesses and include a second metal different from the first metal.

A thickness of the first layer of the first pad portion and a thickness of the first layer of the second pad portion may be substantially the same.

The first pad portion and the second pad portion each may further include a third layer disposed on the second layer. The third layer of the first pad portion and the third layer of the second pad portion may include a third metal different from the first metal and the second metal. The first layer, the second layer, and the third layer of the first pad portion may be sequentially disposed. The first layer, the second layer, and the third layer of the second pad portion may be sequentially disposed.

The first metal may be copper, the second metal may be nickel, and the third metal may be gold.

The circuit board may further include a via layer disposed in the first insulating layer to connect to one of the first pad portion or the second pad portion.

The first layer of the first pad portion and the first layer of the second pad portion may be disposed on a same level with respect to the upper surface of the second insulating layer.

The second layer of the first pad portion and the second layer of the second pad each may penetrate through the upper surface of the second insulating layer and a lower surface of the second insulating layer.

A width of the first pad portion and a width of the second pad portion may be substantially the same.

The circuit board may further include: a semiconductor device disposed on the second insulating layer; and first and second wiring parts connecting the first and second pad portions to the semiconductor device.

According to the embodiments, it is possible to provide the circuit board capable of preventing deterioration in connection characteristics of a microcircuit having a reduced bonding pad pitch, and the method of manufacturing the circuit board.

However, the effects of the embodiments are not limited to the above-described effects, and it is apparent that they can be variously expanded without departing from the spirit and scope of this disclosure.

DETAILED DESCRIPTION OF THE EMBODIMENTS

Figure 1:
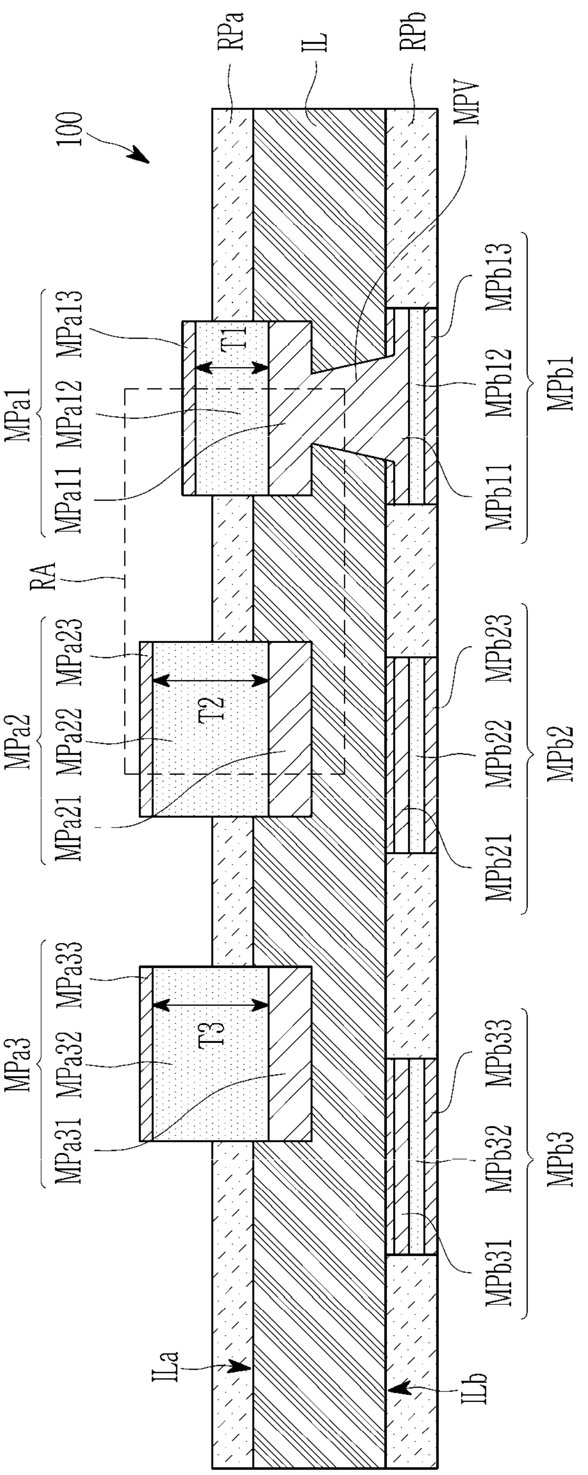
FIG. 1 is a cross-sectional view illustrating a circuit board according to an embodiment.

In the following detailed description, embodiments have been illustrated and described, simply by way of illustration. This disclosure can be variously implemented and is not limited to the following embodiments.

The drawings and description are to be regarded as illustrative in nature and not restrictive. Like reference numerals designate like elements throughout the specification.

Further, the accompanying drawings are provided for helping to easily understand embodiments disclosed in the present specification, and the technical spirit disclosed in the present specification is not limited by the accompanying drawings, and it will be appreciated that this disclosure includes all of the modifications, equivalent matters, and substitutes included in the spirit and the technical scope of this disclosure.

In addition, the size and thickness of each configuration illustrated in the drawings are arbitrarily illustrated for understanding and ease of description, but this disclosure is not limited thereto. In the drawings, the thickness of layers, films, panels, regions, etc., are exaggerated for clarity. In the drawings, for understanding and ease of description, the thickness of some layers and areas is exaggerated.

Further, it will be understood that when an element such as a layer, film, region, or substrate is referred to as being "on" another element, it can be directly on the other element or intervening elements may also be present. In contrast, when an element is referred to as being "directly on" another element, there are no intervening elements present. Further, when an element is "on" a reference portion, the element is located above or below the reference portion, and it does not necessarily mean that the element is located "above" or "on" in a direction opposite to gravity.

In addition, unless explicitly described to the contrary, the word "comprise", and variations such as "comprises" or "comprising", will be understood to imply the inclusion of stated elements but not the exclusion of any other elements.

Further, in the entire specification, when it is referred to as "on a plane", it means when a target part is viewed from above, and when it is referred to as "on a cross-section", it means when the cross-section obtained by cutting a target part vertically is viewed from the side.

Further, throughout the specification, when it is referred to as "connected", this does not only mean that two or more constituent elements are directly connected, but may mean that two or more constituent elements are indirectly connected through another constituent element, are physically connected, electrically connected, or are integrated even though two or more constituent elements are referred as different names depending on a location and a function.

Throughout the specification, a substrate has a structure that is wide in plane and thin in cross-section, a 'planar direction of the substrate' may mean a direction parallel to a wide and flat surface of the substrate, and a 'thickness direction of the substrate' may mean a direction perpendicular to a wide and flat surface of the substrate.

Hereinafter, various embodiments and modifications will be described in detail with reference to the drawings.

Figure 2:
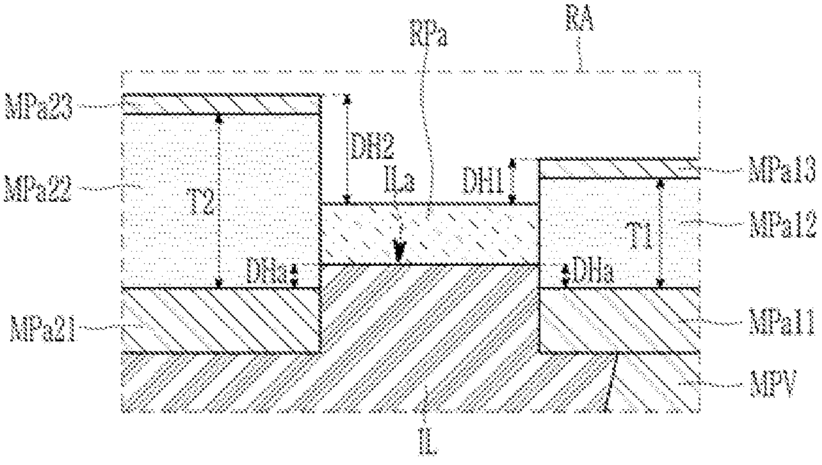
FIG. 2 is an enlarged view of a portion of FIG. 1.

A circuit board according to an embodiment will be described with reference to FIGS. 1 and 2. FIG. 1 is a cross-sectional view illustrating a circuit board according to an embodiment, and FIG. 2 is an enlarged view of a portion of FIG. 1.

A circuit board 100 according to an embodiment includes a first insulating layer IL, a second insulating layer RPa positioned on a first surface ILa of the first insulating layer IL, a third insulating layer RPb positioned on a second surface ILb of the first insulating layer IL opposing the first surface ILa of the first insulating layer IL, a first pad portion MPa1, a second pad portion MPa2, and a third pad portion MPa3 partially buried in the first insulating layer IL, a fourth pad portion MPb1, a fifth pad portion MPb2, and a sixth pad portion MPb3 at least partially buried in the third insulating layer RPb, and a via layer MPV located in the first insulating layer IL and connecting the first pad portion MPa1 and a fourth pad portion MPb1 to each other.

The first insulating layer IL may include a resin insulating layer. For the first insulating layer IL, a thermosetting resin such as epoxy resin, a thermoplastic resin such as polyimide, or a resin impregnated with a reinforcing material such as glass fiber or inorganic filler, for example prepreg, may be used, and the first insulating layer IL may include a thermosetting resin and/or a photocurable resin, but the embodiments is not limited thereto.

The second insulating layer RPa and the third insulating layer RPb may protect wiring and circuit patterns formed in the first insulating layer IL. The second insulating layer RPa and the third insulating layer RPb may include resin and may be solder resist. The thickness of the second insulating layer RPa may be substantially constant, and the thickness of the third insulating layer RPb may be substantially constant.

The first pad portion MPa1 includes a first layer MPa11 buried in the first insulating layer IL, a second layer MPa12 located on the first layer MPa11, partially buried in the first insulating layer IL to extend above the first surface ILa of the first insulating layer IL, and protruding the second insulating layer RPa in which the first insulating layer IL is located on the first surface ILa, and a third layer MPa13 located on the second layer MPa12. In the illustrated embodiment, the first layer MPa11 of the first pad portion MPa1, the second layer MPa12 of the first pad portion MPa1, and the third layer MPa13 of the first pad portion MPa1 are illustrated as being aligned in a vertical direction in line and having the same width as each other, but the second layer MPa12 and the third layer MPa13 of the first pad portion MPa1 may not be aligned with the first layer MPa11 of the first pad portion MPa1 in line and may have different widths.

The second pad portion MPa2 includes a first layer MPa21 buried in the first insulating layer IL, a second layer MPa22 located on the first layer MPa21, partially buried in the first insulating layer IL to extend above the first surface ILa of the first insulating layer IL, and protruding the second insulating layer RPa in which the first insulating layer IL is located on the first surface ILa, and a third layer MPa23 located on the second layer MPa22. In the illustrated embodiment, the first layer MPa21 of the second pad portion MPa2, the second layer MPa22 of the second pad portion MPa2, and the third layer MPa23 of the second pad portion MPa2 are illustrated as being aligned in a vertical direction in line and having the same width as each other, but the second layer MPa22 and the third layer MPa23 of the second pad portion MPa2 may not be aligned with the first layer MPa21 of the second pad portion MPa2 in line and may have different widths.

The third pad portion MPa3 includes a first layer MPa31 buried in the first insulating layer IL, a second layer MPa32 located on the first layer MPa31, partially buried in the first insulating layer IL to extend above the first surface ILa of the first insulating layer IL, and protruding the second insulating layer RPa in which the first insulating layer IL is located on the first surface ILa, and a third layer MPa33 located on the second layer MPa32. In the illustrated embodiment, the first layer MPa31 of the third pad portion MPa3, the second layer MPa32 of the third pad portion MPa3, and the third layer MPa33 of the third pad portion MPa3 are illustrated as being aligned in a vertical direction in line and having the same width as each other, but the second layer MPa32 and the third layer MPa33 of the third pad portion MPa3 may not be aligned with the first layer MPa31 of the third pad portion MPa3 in line and may have different widths.

The second layer MPa12 of the first pad portion MPa1 has a first thickness T1, the second layer MPa22 of the second pad portion MPa2 has a second thickness T2, and the second layer MPa32 of the third pad portion MPa3 may have a third thickness T3.

The first thickness T1 of the second layer MPa12 of the first pad portion MPa1 may be different from the second thickness T2 of the second layer MPa22 of the second pad portion MPa2 and the third thickness T3 of the second layer MPa32 of the third pad portion MPa3. The second thickness T2 of the second layer MPa22 of the second pad portion MPa2 may be different from the third thickness T3 of the second layer MPa32 of the third pad portion MPa3.

The first layer MPa11 of the first pad portion MPa1, the first layer MPa21 of the second pad portion MPa2, and the first layer MPa31 of the third pad portion MPa3 may have substantially the same thickness, and the third layer MPa13 of the first pad portion MPa1, the third layer MPa23 of the second pad portion MPa2, and the third layer MPa33 of the third pad portion MPa3 may have substantially the same thickness. In one example, the configuration in which the thicknesses are substantially the same may indicate that the thicknesses are the same or may indicate that there is a slight difference recognizable by one of ordinary skill in the art due to process errors or positional deviations occurring during the manufacturing process, or errors during measurement.

The first layer MPa11 of the first pad portion MPa1, the first layer MPa21 of the second pad portion MPa2, and the first layer MPa31 of the third pad portion MPa3 may be buried in the first insulating layer IL, so that the surface heights of the first layer MPa11 of the first pad portion MPa1, the first layer MPa21 of the second pad portion MPa2, and the first layer MPa31 of the third pad portion MPa3 may be lower than the surface height of the first insulating layer IL and the surface height of the second insulating layer RPa.

Therefore, the heights of an interface between the first layer MPa11 and the second layer MPa12 of the first pad portion MPa1, an interface between the first layer MPa21 and the second layer MPa22 of the second pad portion MPa2, and an interface between the first layer MPa31 and the second layer MPa32 of the third pad portion MPa3 may be lower than the height of an interface between the first insulating layer IL and the second insulating layer RPa.

The second layer MPa12 of the first pad portion MPa1, the second layer MPa22 of the second pad portion MPa2, and the second layer MPa32 of the third pad portion MPa3 protrude more than the second insulating layer RPa, so that the surface heights of the second layer MPa12 of the first pad portion MPa1, the second layer MPa22 of the second pad portion MPa2, and the second layer MPa32 of the third pad portion MPa3 may be higher than the surface height of the second insulating layer RPa.

The fourth pad portion MPb1 includes a first layer MPb11 positioned under the second surface ILb of the first insulating layer IL, a second layer MPb12 positioned under the first layer MPb11, and a third layer MPb13 positioned under the second layer MPb12. The first layer MPb11, the second layer MPb12, and the third layer MPb13 of the fourth pad portion MPb1 may protrude from the second surface ILb of the first insulating layer IL, and may not protrude from the third insulating layer RPb positioned on the second surface ILb of the first insulating layer IL. In the illustrated embodiment, the first layer MPb11 of the fourth pad portion MPb1, the second layer MPb12 of the fourth pad portion MPb1, and the third layer MPb13 of the fourth pad portion MPb1 are illustrated as being aligned in a vertical direction in line and having the same width as each other, but the second layer MPb12 and the third layer MPb13 of the fourth pad portion MPb1 may not be aligned with the first layer MPb11 of the fourth pad portion MPb1 in line and may have different widths.

The fifth pad portion MPb2 includes a first layer MPb21 positioned under the second surface ILb of the first insulating layer IL, a second layer MPb22 positioned under the first layer MPb21, and a third layer MPb23 positioned under the second layer MPb22. The first layer MPb21, the second layer MPb22, and the third layer MPb23 of the fifth pad portion MPb2 may protrude from the second surface ILb of the first insulating layer IL, and may not protrude from the third insulating layer RPb positioned on the second surface ILb of the first insulating layer IL. In the illustrated embodiment, the first layer MPb21 of the fifth pad portion MPb2, the second layer MPb22 of the fifth pad portion MPb2, and the third layer MPb23 of the fifth pad portion MPb2 are illustrated as being aligned in a vertical direction in line and having the same width as each other, but the second layer MPb22 and the third layer MPb23 of the fifth pad portion MPb2 may not be aligned with the first layer MPb21 of the fifth pad portion MPb2 in line and may have different widths.

The sixth pad portion MPb3 includes a first layer MPb31 positioned under the second surface ILb of the first insulating layer IL, a second layer MPb32 positioned under the first layer MPb31, and a third layer MPb33 positioned under the second layer MPb32. The first layer MPb31, the second layer MPb32, and the third layer MPb33 of the sixth pad portion MPb3 may protrude from the second surface ILb of the first insulating layer IL, and may not protrude from the third insulating layer RPb positioned on the second surface ILb of the first insulating layer IL. In the illustrated embodiment, the first layer MPb31 of the sixth pad portion MPb3, the second layer MPb32 of the sixth pad portion MPb3, and the third layer MPb33 of the sixth pad portion MPb3 are illustrated as being aligned in a vertical direction in line and having the same width as each other, but the second layer MPb32 and the third layer MPb33 of the sixth pad portion MPb3 and the first layer MPb31 of the sixth pad portion MPb3 may not be aligned with the first layer MPb31 of the sixth pad portion MPb3 in line and may have different widths.

The first layer MPa11 of the first pad portion MPa1 and the first layer MPb11 of the fourth pad portion MPb1 may be connected to each other through the via layer MPV positioned inside the first insulating layer IL.

The second insulating layer RPa positioned on the first surface ILa of the first insulating layer IL is positioned on the side surfaces of the second layer MPa12 of the first pad portion MPa1, the second layer MPa22 of the second pad portion MPa2, and the second layer MPa32 of the third pad portion MPa3, to prevent a short between the first pad portion MPa1, the second pad portion MPa2, and the third pad portion MPa3.

The third insulating layer RPb positioned on the second surface ILb of the first insulating layer IL is positioned on the side surfaces of the fourth pad portion MPb1, the fifth pad portion MPb2, and the sixth pad portion MPb3 to prevent a short between the fourth pad portion MPb1, the fifth pad portion MPb2, and the sixth pad portion MPb3.

The first layer MPa11 of the first pad portion MPa1, the first layer MPa21 of the second pad portion MPa2, the first layer MPa31 of the third pad portion MPa3, the first layer MPb11 of the fourth pad portion MPb1, the first layer MPb21 of the fifth pad portion MPb2, and the first layer MPb31 of the sixth pad portion MPb3 may have conductivity, and may include a metal. For example, the first layer MPa11 of the first pad portion MPa1, the first layer MPa21 of the second pad portion MPa2, the first layer MPa31 of the third pad portion MPa3, the first layer MPb11 of the fourth pad portion MPb1, the first layer MPb21 of the fifth pad portion MPb2, and the first layer MPb31 of the sixth pad portion MPb3 may include copper (Cu).

The second layer MPa12 of the first pad portion MPa1, the second layer MPa22 of the second pad portion MPa2, the second layer MPa32 of the third pad portion MPa3, the second layer MPb12 of the fourth pad portion MPb1, the second layer MPb22 of the fifth pad portion MPb2, and the second layer MPb32 of the sixth pad portion MPb3 may have conductivity, and may include a metal. For example, the second layer MPa12 of the first pad portion MPa1, the second layer MPa22 of the second pad portion MPa2, the second layer MPa32 of the third pad portion MPa3, the second layer MPb12 of the fourth pad portion MPb1, the second layer MPb22 of the fifth pad portion MPb2, and the second layer MPb32 of the sixth pad portion MPb3 may include nickel (Ni) and may be formed by a plating method.

The third layer MPa13 of the first pad portion MPa1, the third layer MPa23 of the second pad portion MPa2, the third layer MPa33 of the third pad portion MPa3, the third layer MPb13 of the fourth pad portion MPb1, the third layer MPb23 of the fifth pad portion MPb2, and the third layer MPb33 of the sixth pad portion MPb3 may have conductivity, and may include a metal. The third layer MPa13 of the first pad portion MPa1, the third layer MPa23 of the second pad portion MPa2, the third layer MPa33 of the third pad portion MPa3, the third layer MPb13 of the fourth pad portion MPb1, the third layer MPb23 of the fifth pad portion MPb2, and the third layer MPb33 of the sixth pad portion MPb3 may include gold (Au) and may be formed by a plating method.

In the illustrated embodiment, the first insulating layer IL is illustrated as being formed of one layer, but this disclosure is not limited thereto, and the first insulating layer IL may include a plurality of layers, and the via layer MPV may be formed inside the plurality of layers of the first insulating layer IL.

Referring to FIG. 2 together with FIG. 1, the first layer MPa11 of the first pad portion MPa1 and the first layer MPa21 of the second pad portion MPa2 are buried in the first insulating layer IL, and the surface of the first layer MPa11 of the first pad portion MPa1 and the first layer MPa21 of the second pad portion MPa2 and the surface of the first surface ILa of the first insulating layer IL may have a depth difference DHa. Although only portions of the first pad portion MPa1 and the second pad portion MPa2 are illustrated in FIG. 2, similarly, the surface of the first layer MPa31 of the third pad portion MPa3 and the surface of the first surface ILa of the first insulating layer IL may have a depth difference DHa.

The thickness of the first layer MPa11 of the first pad portion MPa1 and the thickness of the first layer MPa21 of the second pad portion MPa2 may be substantially the same, and the thickness of the third layer MPa13 of the first pad portion MPa1 and a thickness of the third layer MPa23 of the second pad portion MPa2 may be substantially the same. In FIG. 2, only portions of the first pad portion MPa1 and the second pad portion MPa2 are illustrated, but the thickness of the first layer MPa31 of the third pad portion MPa3 is substantially the same as the thickness of the first layer MPa11 of the first pad portion MPa1 and the first layer MPa21 of the second pad portion MPa2, and the thickness of the third layer MPa33 of the third pad portion MPa3 is also substantially the same as the thickness of the third layer MPa13 of the first pad portion MPa1 and the third layer MPa23 of the second pad portion MPa2.

A part of the second layer MPa12 of the first pad portion MPa1 and a part of the second layer MPa22 of the second pad portion MPa2 are buried in the first insulating layer IL, and the second layer MPa12 of the first pad portion MPa1 and the second layer MPa22 of the second pad portion MPa2 may protrude beyond the second insulating layer RPa. In FIG. 2, only portions of the first pad portion MPa1 and the second pad portion MPa2 are illustrated, but the portion of the second layer MPa32 of the third pad portion MPa3 is also buried in the first insulating layer IL, and the second layer MPa32 of the third pad portion MPa3 may protrude beyond the second insulating layer RPa.

The first thickness T1 of the second layer MPa12 of the first pad portion MPa1 may be different from the second thickness T2 of the second layer MPa22 of the second pad portion MPa2. In FIG. 2, only parts of the first pad portion MPa1 and the second pad portion MPa2 are illustrated, but the third thickness T3 of the second layer MPa32 of the third pad portion MPa3 may also be different from the first thickness T1 of the second layer MPa12 of the first pad portion MPa1 and the second thickness T2 of the second layer MPa22 of the second pad portion MPa2.

As such, the first thickness T1 of the second layer MPa12 of the first pad portion MPa1, the thickness T2 of the second layer MPa22 of the second pad portion MPa2, and the third thickness T3 of the second layer MPa32 of the third pad portion MPa3 may be different from each other, and accordingly, the total thicknesses of the first pad portion MPa1, the second pad portion MPa2, and the third pad portion MPa3 may be different from each other. Accordingly, the heights of portions of the first pad portion MPa1, the second pad portion MPa2, and the third pad portion MPa3 protruding from the second insulating layer RPa may also be different. In the illustrated embodiment, the first pad portion MPa1 protrudes from the second insulating layer RPa by a first protruding height DH1, and the second pad portion MPa2 protrudes from the second insulating layer RPa by a second protrusion height DH2, and the first protrusion height DH1 and the second protrusion height DH2 may be different from each other.

Therefore, even though the pitches of the pad portions MPa1, MPa2, and MPa3 are reduced because the sizes and intervals of the first pad portion MPa1, the second pad portion MPa2, and the third pad portion MPa3 are reduced, when the conductive wires for connection with the semiconductor chip are bonded to the first pad portion MPa1, the second pad portion MPa2, and the third pad portion MPa3, short circuits may be prevented and a stable connection may be maintained.

Figure 3:
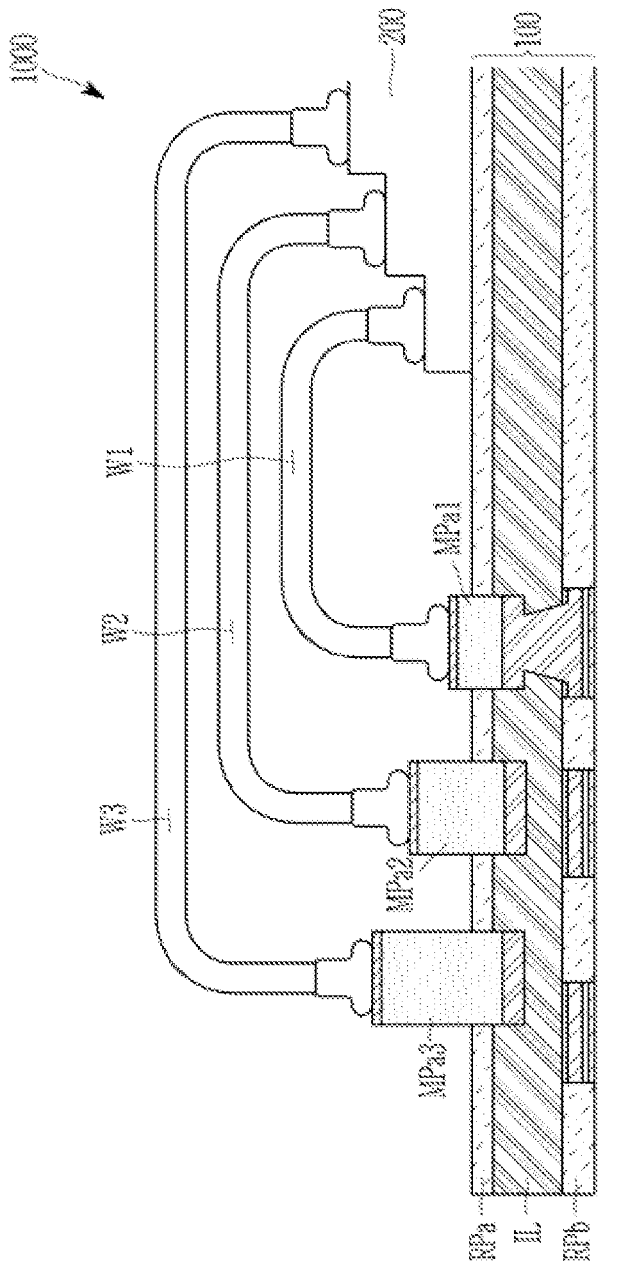
FIG. 3 is a diagram illustrating a part of a semiconductor package including a circuit board according to an embodiment.

Then, a semiconductor package including the circuit board according to the embodiment will be described with reference to FIG. 3 along with FIGS. 1 and 2. FIG. 3 is a diagram illustrating a part of a semiconductor package including a circuit board according to an embodiment.

As illustrated in FIG. 3, a semiconductor package 1000 including the circuit board according to the embodiment may include a first wire part W1 connected to the first pad portion MPa1 of the circuit board 100 according to the embodiment illustrated in FIGS. 1 and 2, a second wire part W2 connected to the second pad portion MPa2, a third wire part W3 connected to the third pad portion MPa3, and a semiconductor device 200 connected to the circuit board 100 through the first wire part W1, the second wire part W2, and the third wire part W3.

The first wire part W1, the second wire part W2, and the third wire part W3 may be wire bonded.

The height of the first wire part W1 connected to the first pad portion MPa1 having the relatively lowest height may be the lowest, and the height of the third wire part W3 connected to the third pad portion MPa3 having the relatively highest height may be the highest.

As illustrated in FIG. 1, the first thickness T1 of the second layer MPa12 of the first pad portion MPa1, the thickness T2 of the second layer MPa22 of the second pad portion MPa2, and the third thickness T3 of the second layer MPa32 of the third pad portion MPa3 may be different from each other, and accordingly, the total thicknesses of the first pad portion MPa1, the second pad portion MPa2, and the third pad portion MPa3 may be different from each other. Accordingly, the heights of portions of the first pad portion MPa1, the second pad portion MPa2, and the third pad portion MPa3 protruding from the second insulating layer RPa located on the first surface ILa of the first insulating layer IL may also be different from each other.

Accordingly, the junction heights of the conductive wires W1, W2, and W3 for connection between the first pad portion MPa1, the second pad portion MPa2, and the third pad portion MPa3 and the semiconductor device 200 may be different, and even though the pitches of the pad portions MPa1, MPa2, and MPa3 are reduced because the size and intervals of the first pad portion MPa1, the second pad portion MPa2, and the third pad portion MPa3 are reduced, the conductive wires W1, W2, and W3 connected to the first pad portion MPa1, the second pad portion MPa2, and the third pad portion MPa3 may be prevented from being shorted with each other and a stable connection may be maintained.

Many features of the circuit board 100 according to the embodiment described above with reference to FIGS. 1 and 2 may be applied to a semiconductor package including the circuit board according to the present embodiment.

Figure 4:
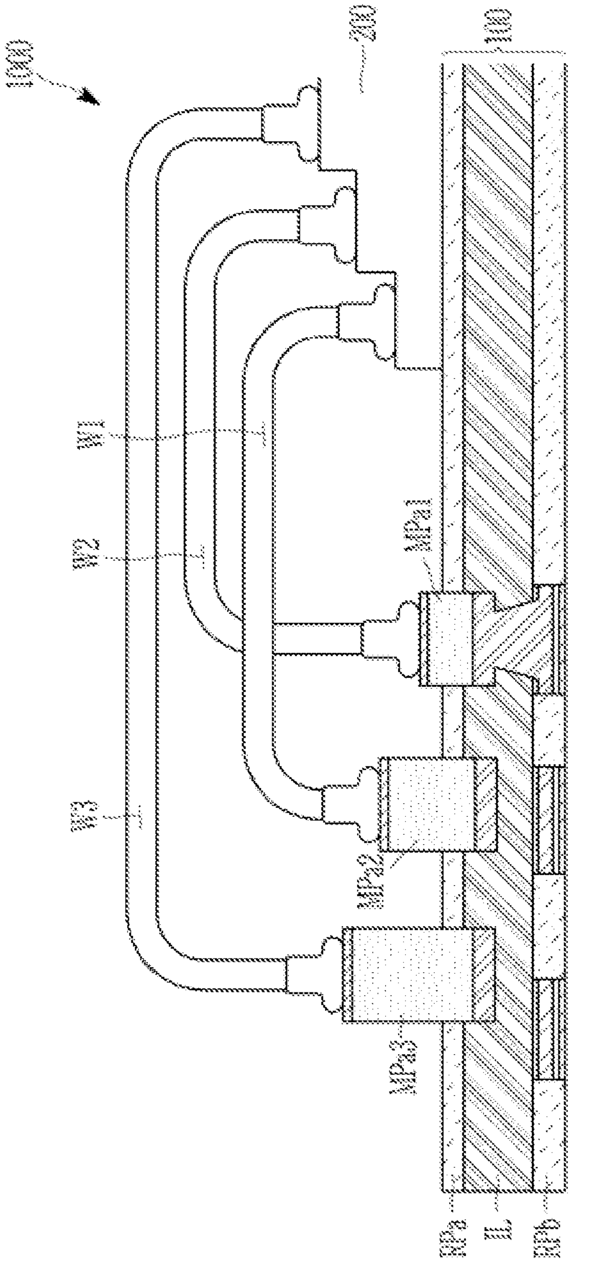
FIG. 4 is a diagram illustrating a part of a semiconductor package including a circuit board according to an embodiment.

Then, referring to FIG. 4 along with FIGS. 1 and 2, a semiconductor package including the circuit board according to the embodiment will be described. FIG. 4 is a diagram illustrating a part of a semiconductor package including the circuit board according to the embodiment.

As illustrated in FIG. 4, a semiconductor package 1000 including the circuit board according to the embodiment may include a first wire part W1 connected to the second pad portion MPa2 of the circuit board 100 according to the embodiment illustrated in FIGS. 1 and 2, a second wire part W2 connected to the first pad portion MPa1, a third wire part W3 connected to the third pad portion MPa3, and a semiconductor device 200 connected to the circuit board 100 through the first wire part W1, the second wire part W2, and the third wire part W3.

The first wire part W1, the second wire part W2, and the third wire part W3 may be wire bonded.

The height of the first wire part W1 connected to the second pad portion MPa2 may be the lowest, and the height of the third wire part W3 connected to the third pad portion MPa3 having the relatively highest height may be the highest.

As illustrated in FIG. 1, the first thickness T1 of the second layer MPa12 of the first pad portion MPa1, the thickness T2 of the second layer MPa22 of the second pad portion MPa2, and the third thickness T3 of the second layer MPa32 of the third pad portion MPa3 may be different from each other, and accordingly, the total thicknesses of the first pad portion MPa1, the second pad portion MPa2, and the third pad portion MPa3 may be different from each other. Accordingly, the heights of portions of the first pad portion MPa1, the second pad portion MPa2, and the third pad portion MPa3 protruding from the second insulating layer RPa located on the first surface ILa of the first insulating layer IL may also be different from each other.

Accordingly, the junction heights of the conductive wires W1, W2, and W3 for connection between the first pad portion MPa1, the second pad portion MPa2, and the third pad portion MPa3 and the semiconductor device 200 may be different, and even though the pitches of the pad portions MPa1, MPa2, and MPa3 are reduced because the size and intervals of the first pad portion MPa1, the second pad portion MPa2, and the third pad portion MPa3 are reduced, the conductive wires W1, W2, and W3 connected to the first pad portion MPa1, the second pad portion MPa2, and the third pad portion MPa3 may be prevented from being shorted with each other and a stable connection may be maintained.

Many features of the circuit board 100 according to the embodiment described above with reference to FIGS. 1 and 2 may be applied to a semiconductor package including the circuit board according to the present embodiment.

Then, with reference to FIGS. 5 to 22 together with FIGS. 1 and 2, a method of manufacturing a circuit board according to an embodiment will be described. FIGS. 5 to 22 are cross-sectional views illustrating a method of manufacturing a circuit board according to an embodiment.

Figure 5:
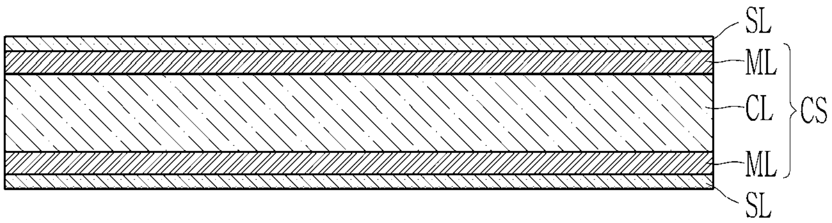
FIGS. 5 to 22 are cross-sectional views illustrating a method of manufacturing a circuit board according to an embodiment.

Referring to FIG. 5, a carrier substrate CS including a core part CL and thin metal layers ML stacked on both sides of the core part CL is provided, and a first seed layer SL is provided on the thin metal layer ML.

Figure 6:
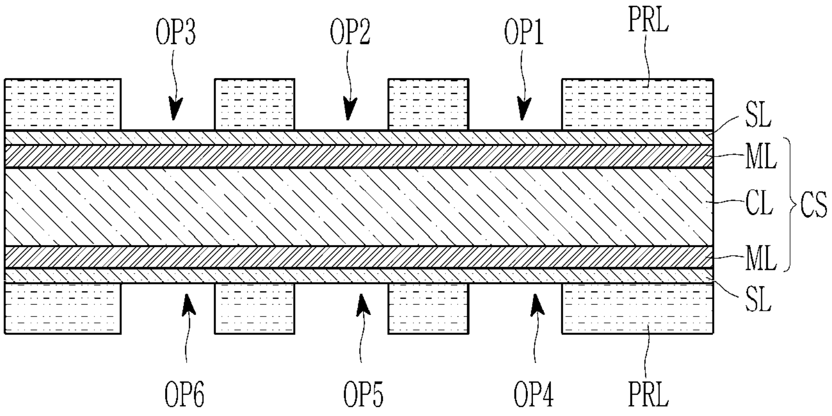

Referring to FIG. 6, a resist pattern PRL having a first opening OP1, a second opening OP2, and a third opening OP3 is formed on the first seed layer SL positioned on each of both sides of the carrier substrate CS.

The resist pattern PRL may be formed by stacking a resist layer on the first seed layer SL and then exposing and developing the resist layer.

The first opening OP1 may correspond to a position where the first pad portion MPa1 is to be formed, the second opening OP2 may correspond to a position where the second pad portion MPa2 is to be formed, and the third opening OP3 may correspond to a position where the third pad portion MPa3 is to be formed.

Figure 7:
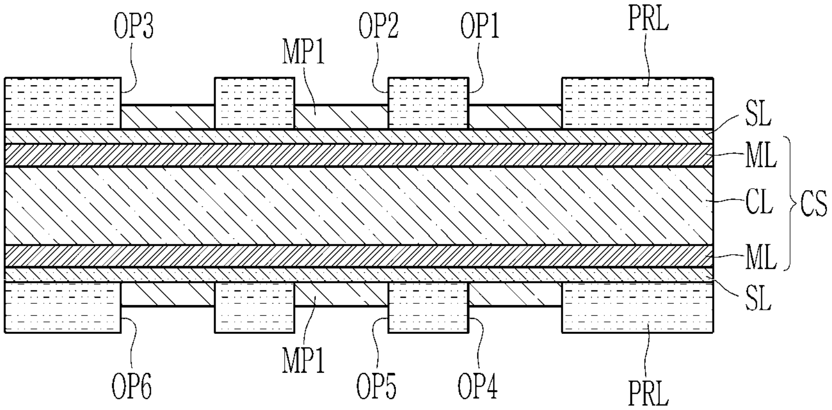

As illustrated in FIG. 7, a first metal layer MP1 is formed by plating a metal on the first seed layer SL by using the resist pattern PRL as a mask. The first opening OP1, the second opening OP2, and the third opening OP3 of the resist pattern PRL may expose the first seed layer SL, and the first metal layer MP1 is formed on the first seed layer SL by a plating method and may be positioned within the first opening OP1, the second opening OP2, and the third opening OP3 of the resist pattern PRL.

The first metal layer MP1 may include the first layer MPa11 of the first pad portion MPa1, the first layer MPa21 of the second pad portion MPa2, and the first layer MPa31 of the third pad portion MPa3.

Figure 8:
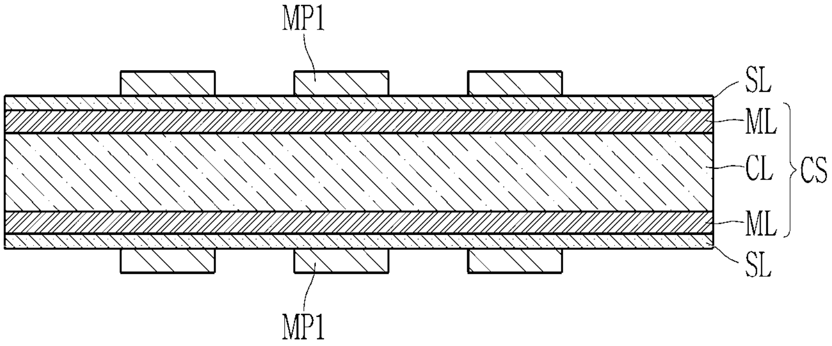

Referring to FIG. 8, the resist pattern PRL is removed.

Figure 9:
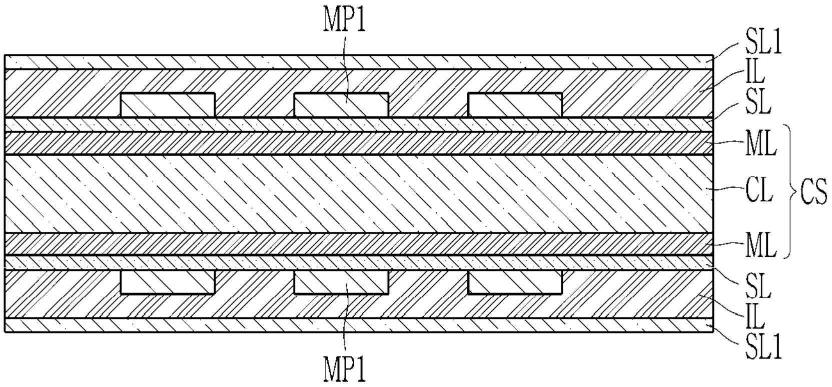

As illustrated in FIG. 9, a first insulating layer IL and a second seed layer SL1 are sequentially stacked on the first metal layer MP1.

Figure 10:
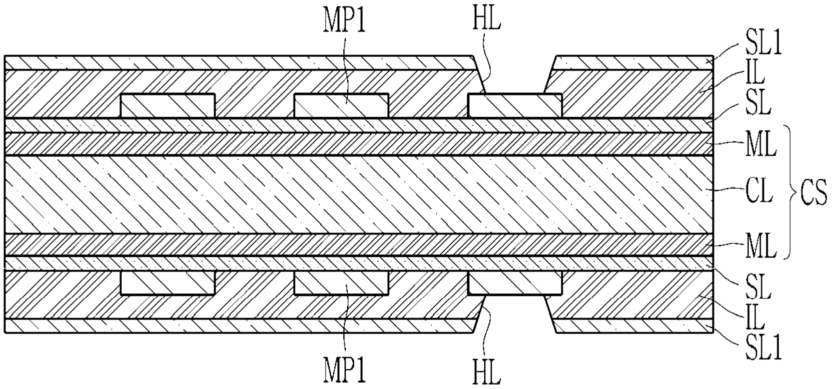

Referring to FIG. 10, a via hole HL is formed in the first insulating layer IL and the second seed layer SL1.

Figure 11:
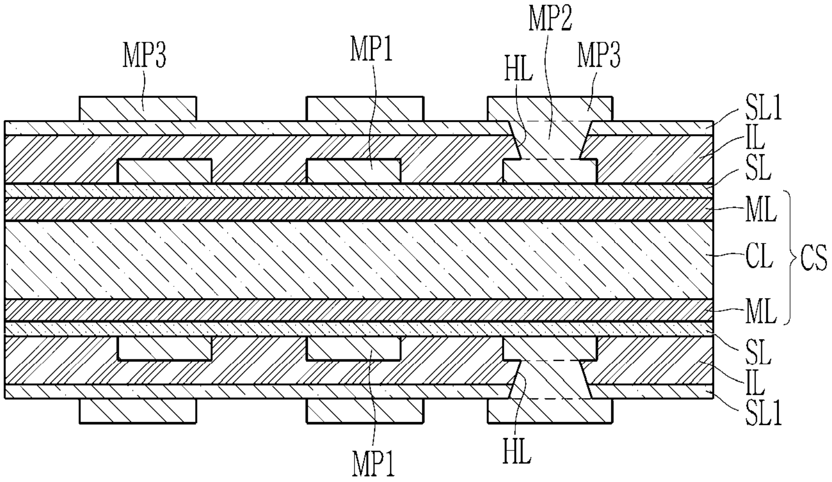

As illustrated in FIG. 11, a second metal layer MP2 forming a via layer is formed in the via hole HL, and a third metal layer MP3 forming the first layer MPb11 of the fourth pad portion MPb1, the first layer MPb21 of the fifth pad portion MPb2, and the first layer MPb3 of the sixth pad portion MPb3 is formed on the second seed layer SL1. The second metal layer MP2 and the third metal layer MP3 may include the same metal as that of the first metal layer MP1 and may be formed by a plating method.

Figure 12:
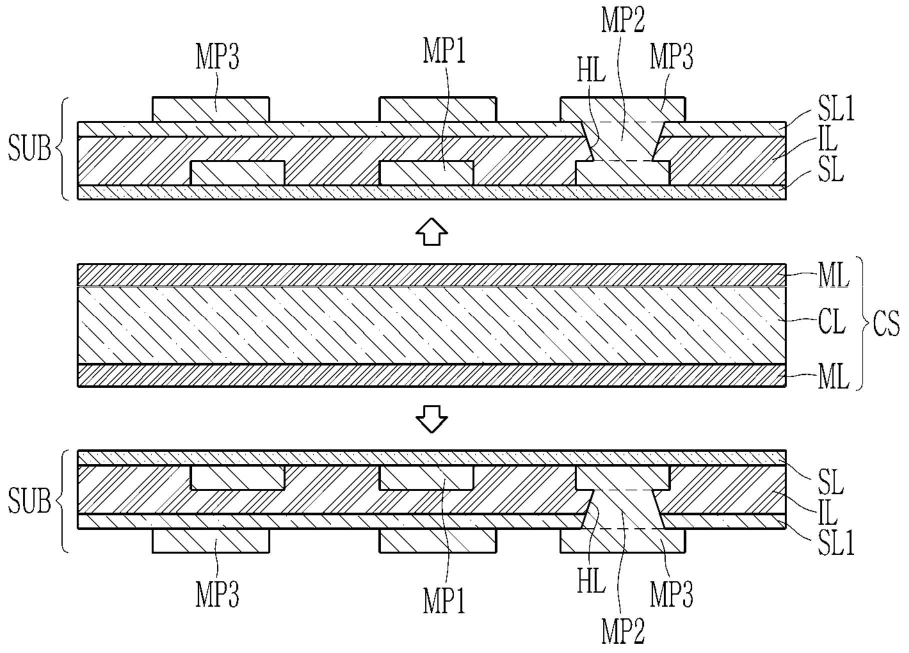

As illustrated in FIG. 12, a substrate portion SUB is peeled from both sides of the core portion CL.

Figure 13:
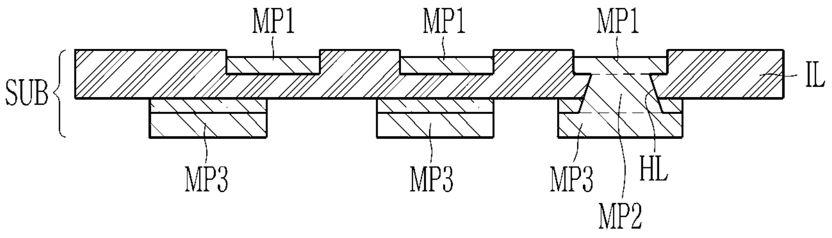

In FIG. 13, hereinafter, one substrate portion SUB of two substrate portions SUB peeled from both sides of the core portion CL is illustrated.

Referring to FIG. 13, the first seed layer SL is removed from the substrate portion SUB peeled from the core portion CL, and the exposed portion of the second seed layer SL1 is removed. In this case, a part of the surface of the first metal layer MP1 is also removed, so that the surface height of the first metal layer MP1 may be lower than that of the first insulating layer IL.

Figure 14:
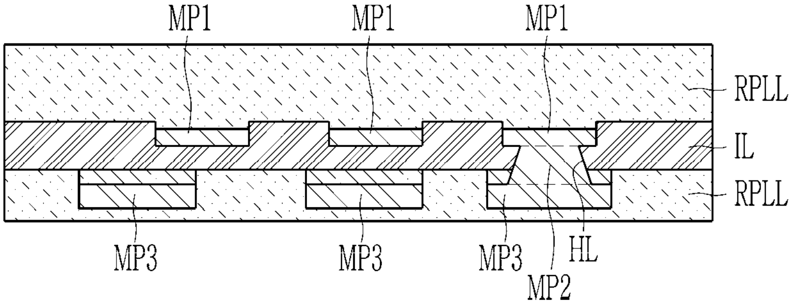

As illustrated in FIG. 14, insulating layers RPLL forming a second insulating layer RPa and a third insulating layer RPb are stacked on the first surface ILa and the second surface ILb of the first insulating layer IL that face each other.

In this case, the thickness of the insulating layer RPLL formed on the first surface ILa of the first insulating layer IL is formed thicker than the thickness of the insulating layer RPLL formed on the second surface ILb of the first insulating layer IL.

The insulating layer RPLL may be a solder resist layer. The insulating layer RPLL may be formed by using solder resist ink, a solder resist film, or an encapsulant, but the embodiment is not limited thereto.

Figure 15:
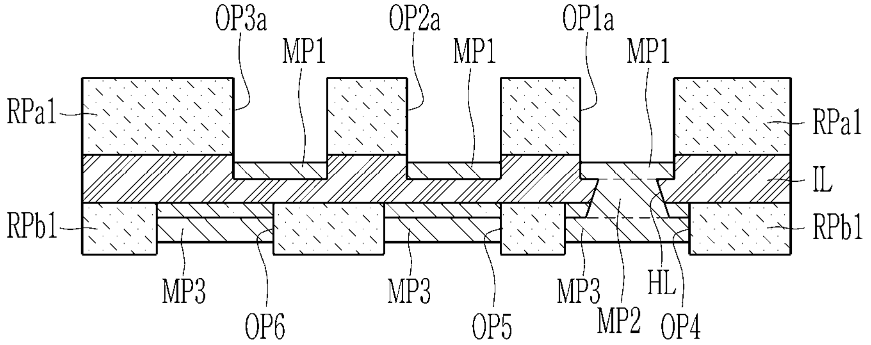

Referring to FIG. 15, by exposing and developing the insulating layer RPLL, a fourth insulating layer RPa1 having a fourth opening OP1*a*, a fifth opening OP2*a*, and a sixth opening OP3*a* is formed on the first surface ILa of the first insulating layer IL, and a fifth insulating layer RPb1 having a seventh opening OP4, an eighth opening OP5, and a ninth opening OP6 is formed on the second surface ILb of the first insulating layer IL.

The fourth opening OP1*a*, the fifth opening OP2*a*, and the sixth opening OP3*a* formed in the first surface ILa in the insulating layer RPLL formed on the first surface ILa of the first insulating layer IL may overlap the first metal layer MP1 serving as the first layer MPa11 of the first pad portion MPa1, the first layer MPa21 of the second pad portion MPa2, and the first layer MPa31 of the third pad portion MPa3.

The seventh opening OP4, the eighth opening OP5, and the ninth opening OP6 formed in the insulating layer RPLL formed on the second surface ILb of the first insulating layer IL may overlap the third metal layer MP3 serving as the first layer MPb11 of the fourth pad portion MPb1, the first layer MPb21 of the fifth pad portion MPb2, and the first layer MPb31 of the sixth pad portion MPb3.

Figure 16:
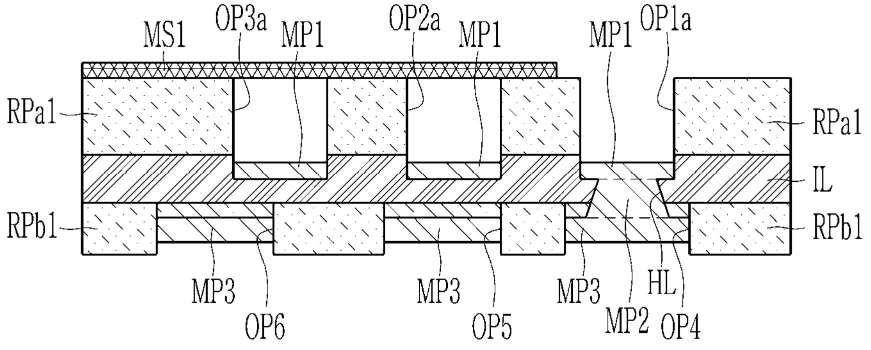

Referring to FIG. 16, the fifth opening OP2*a* and the sixth opening OP3*a* of the fourth insulating layer RPa1 are covered by a first mask MS1.

Figure 17:
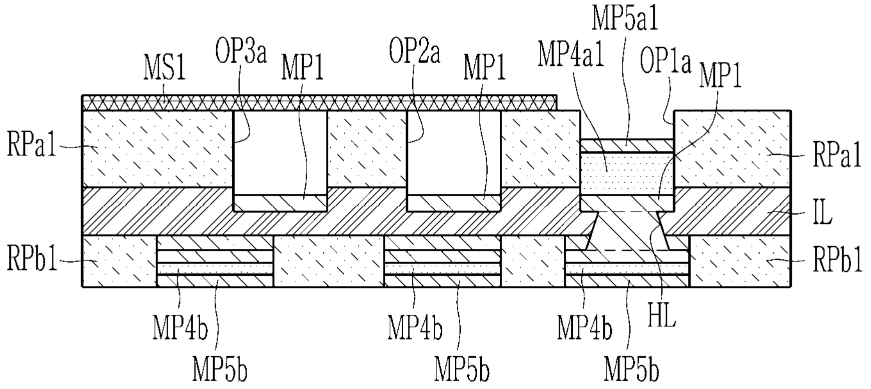

As illustrated in FIG. 17, a first plating layer MP4*a*1 and a second plating layer MP5*a*1 are formed on the first metal layer MP1 overlapping the fourth opening OP1*a*, and a third plating layer MP4*b* and a fourth plating layer MP5*b* are formed on the third metal layer MP3 overlapping the seventh opening OP4, the eighth opening OP5, and the ninth opening OP6 of the fifth insulating layer RPb1.

The first plating layer MP4*a*1 and the second plating layer MP5*a*1 may become the second layer MPa12 and the third layer MPa13 of the first pad portion MPa1.

The third plating layer MP4*b* may become the second layer MPb12 of the fourth pad portion MPb1, the second layer MPb22 of the fifth pad portion MPb2, and the second layer MPb32 of the sixth pad portion MPb3, and the fourth plating layer MP5*b* may become the third layer MPb13 of the fourth pad portion MPb1, the third layer MPb23 of the fifth pad portion MPb2, and the third layer MPb33 of the sixth pad portion MPb3.

Figure 18:
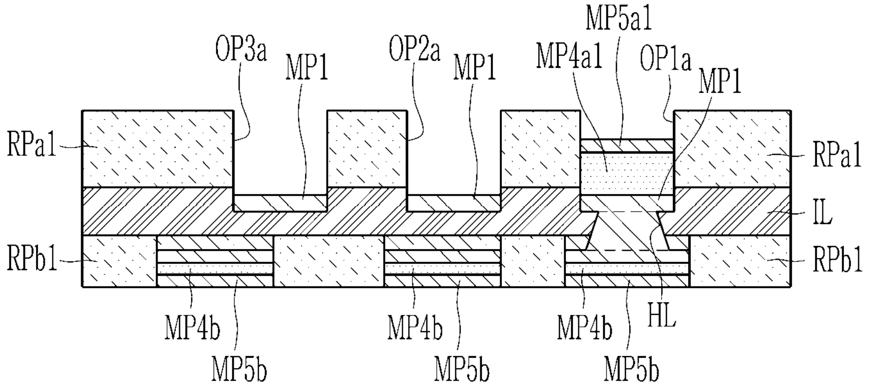
Figure 19:
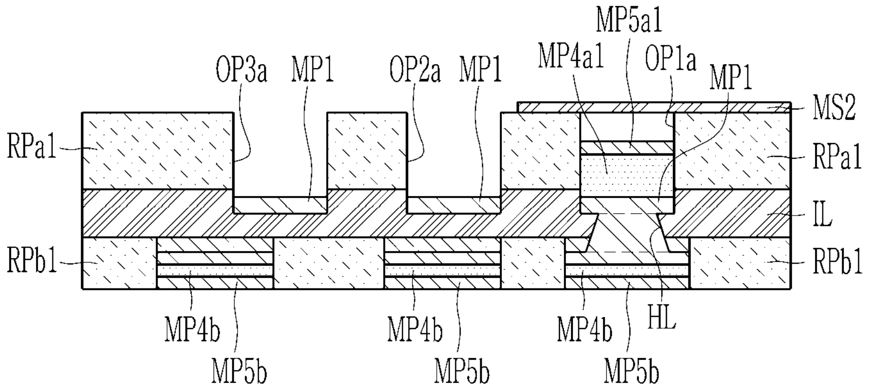

Referring to FIG. 18, the first mask MS1 is removed, and as illustrated in FIG. 19, the fourth opening OP1*a* of the fourth insulating layer RPa1 is covered with the second mask MS2.

Figure 20:
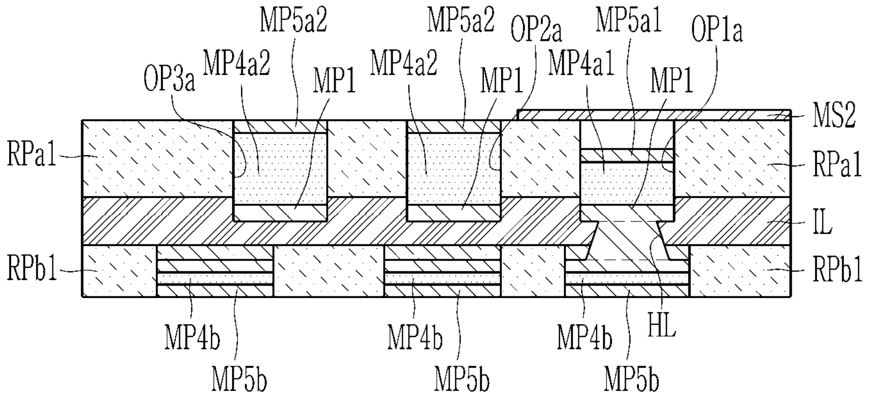

As illustrated in FIG. 20, a fifth plating layer MP4*a*2 and a sixth plating layer MP5*a*2 are formed on the first metal layer MP1 overlapping the fifth opening OP2*a* and the sixth opening OP3*a* of the fourth insulating layer RPa1.

The fifth plating layer MP4*a*2 and the sixth plating layer MP5*a*2 positioned in the fifth opening OP2*a* of the fourth insulating layer RPa1 may become the second layer MPa22 and the third layer MPa23 of the second pad portion MPa2, and the fifth plating layer MP4*a*2 and the sixth plating layer MP5*a*2 positioned in the sixth opening OP3*a* of the fourth insulating layer RPa1 may become the second layer MPa32 and the third layer MPa33 of the third pad portion MPa3.

In the method of manufacturing the circuit board according to the embodiment illustrated in FIG. 20, it is illustrated that the fifth plating layer MP4*a*2 and the sixth plating layer MP5*a*2 are formed together on the first metal layer MP1 overlapping the fifth opening OP2*a* and the sixth opening OP3*a* of the fourth insulating layer RPa1, but the embodiment is not limited thereto, and the operation of forming the fifth plating layer MP4*a*2 and the sixth plating layer MP5*a*2 on the first metal layer MP1 overlapping the fifth opening OP2*a* of the fourth insulating layer RPa1 and the operation of forming the fifth plating layer MP4*a*2 and the sixth plating layer MP5*a*2 on the first metal layer MP1 overlapping the sixth opening OP3*a* of the fourth insulating layer RPa1 are not performed together, and may be separately formed. In addition, the thickness of the fifth plating layer MP4*a*2 formed on the first metal layer MP1 overlapping the fifth opening OP2*a* of the fourth insulating layer RPa1 and the thickness of the fifth plating layer MP4*a*2 formed on the first metal layer MP1 overlapping the sixth opening OP3*a* of the fourth insulating layer RPa1 may be different from each other.

Figure 21:
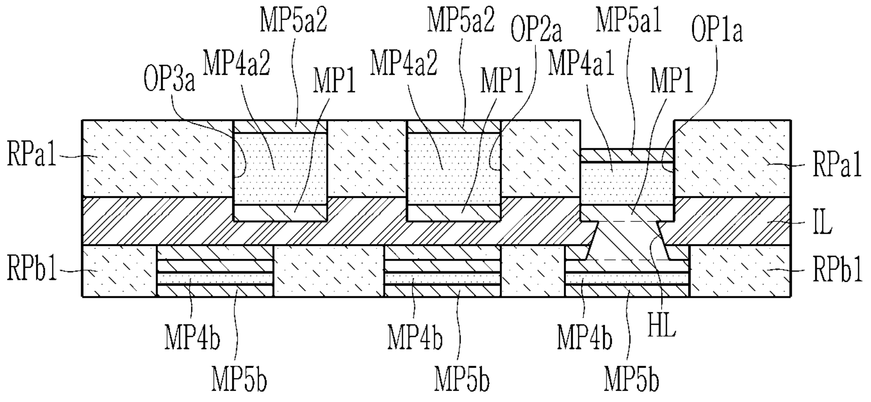

As illustrated in FIG. 21, the second mask MS2 may be removed.

Figure 22:
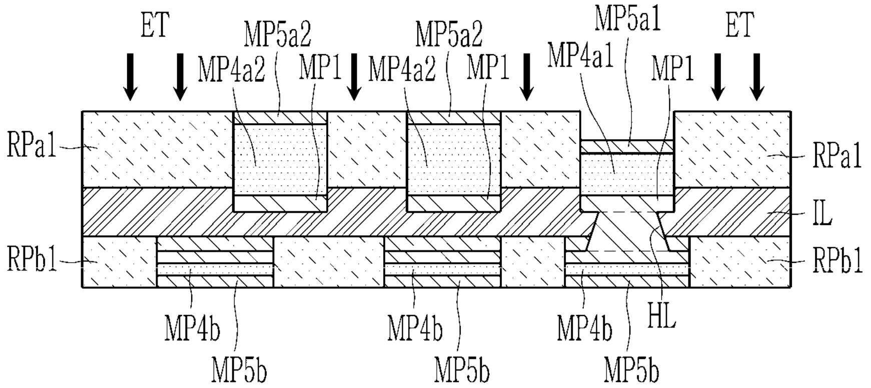

As illustrated in FIG. 22, by etching and removing the fourth insulating layer RPa1, the second insulating layer RPa located on the first surface ILa of the first insulating layer IL is completed by lowering the height of the fourth insulating layer RPa1 as illustrated in FIG. 1, so that upper portions of the second layers MPa12, MPa22, and MPa32 of the first pad portion MPa1, the second pad portion MPa2, and the third pad portion MPa3 are formed to protrude above the surface of the second insulating layer RPa.

Although the embodiment has been described, this disclosure is not limited thereto, and it is possible to carry out various modifications within the scope of the claims, the detailed description of the embodiment, and the accompanying drawings, and the modifications belong to the scope of this disclosure as a matter of course.

What is claimed is:

1. A circuit board, comprising:
a first insulating layer;
a second insulating layer positioned on the first insulating layer; and
a first pad portion and a second pad portion which are partially buried in the first insulating layer, protrude from the second insulating layer, and have different thicknesses,
wherein the first pad portion and the second pad portion each include a first layer and a second layer positioned on the first layer, and
the second layer of the first pad portion and the second layer of the second pad portion are in contact with the first insulating layer.

2. The circuit board of claim 1, wherein:
a thickness of the second layer of the first pad portion is different from a thickness of the second layer of the second pad portion.

3. The circuit board of claim 2, wherein:
a thickness of the first layer of the first pad portion and a thickness of the first layer of the second pad portion are substantially the same.

4. The circuit board of claim 3, wherein:
the first pad portion and the second pad portion each further include a third layer positioned on the second layer.

5. The circuit board of claim 4, wherein:
a thickness of the third layer of the first pad portion and a thickness of the third layer of the second pad portion are substantially the same.

6. The circuit board of claim 5, wherein:
the first layer, the second layer, and the third layer include different metals.

7. The circuit board of claim 6, wherein:
the first layer includes copper, the second layer includes nickel, and the third layer includes gold.

8. The circuit board of claim 1, wherein:
the second insulating layer is located on a side surface of the second layer of the first pad portion and the second layer of the second pad portion, and
a thickness of the second insulating layer positioned on the side surface of the second layer of the first pad portion and a thickness of the second insulating layer positioned on the side surface of the second layer of the second pad portion are substantially the same.

9. The circuit board of claim 8, wherein:
the second insulating layer includes a solder resist layer.

10. The circuit board of claim 1, further comprising:
a third insulating layer positioned under the first insulating layer; and
a third pad portion buried in the third insulating layer.

11. The circuit board of claim 10, further comprising:
a via layer located in the first insulating layer,
wherein the first pad portion and the third pad portion are connected to each other through the via layer.

12. A circuit board, comprising:

a first insulating layer;

a second insulating layer positioned on the first insulating layer; and a first pad portion and a second pad portion which are partially buried in the first insulating layer and protrude from an upper surface of the second insulating layer to have different heights with respect to the upper surface of the second insulating layer, wherein the first pad portion and the second pad portion each include a first layer and a second layer disposed on the first layer and being in contact with the first insulating layer, and the first layer of the first pad portion and the first layer of the second pad portion include a first metal, and the second layer of the first pad portion and the second layer of the second pad portion have different thicknesses and include a second metal different from the first metal.

13. The circuit board of claim 12, wherein:

a thickness of the first layer of the first pad portion and a thickness of the first layer of the second pad portion are substantially the same.

14. The circuit board of claim 12, wherein:

the first pad portion and the second pad portion each further include a third layer disposed on the second layer, the third layer of the first pad portion and the third layer of the second pad portion include a third metal different from the first metal and the second metal, the first layer, the second layer, and the third layer of the first pad portion are sequentially disposed, and the first layer, the second layer, and the third layer of the second pad portion are sequentially disposed.

15. The circuit board of claim 14, wherein:

the first metal is copper, the second metal is nickel, and the third metal is gold.

16. The circuit board of claim 12, further comprising:

a via layer disposed in the first insulating layer to connect to one of the first pad portion or the second pad portion.

17. The circuit board of claim 12, wherein:

the first layer of the first pad portion and the first layer of the second pad portion are disposed on a same level with respect to the upper surface of the second insulating layer.

18. The circuit board of claim 12, wherein:

the second layer of the first pad portion and the second layer of the second pad each penetrate through the upper surface of the second insulating layer and a lower surface of the second insulating layer.

19. The circuit board of claim 12, wherein:

a width of the first pad portion and a width of the second pad portion are substantially the same.

20. The circuit board of claim 12, further comprising a semiconductor device disposed on the second insulating layer; and first and second wiring parts connecting the first and second pad portions to the semiconductor device.

* * * * *